United States Patent [19]

Takamine et al.

[11] Patent Number: 4,672,312
[45] Date of Patent: Jun. 9, 1987

[54] GIGA-HERTZ TEST JIG

[75] Inventors: Henry K. Takamine, Gardena; Leonard Olivares, Long Beach, both of Calif.

[73] Assignee: Hughes Aircraft Company, Los Angeles, Calif.

[21] Appl. No.: 684,421

[22] Filed: Dec. 20, 1984

[51] Int. Cl.$^4$ .......................................... G01R 1/04
[52] U.S. Cl. .................. 324/158 F; 324/158 P; 324/73 PC
[58] Field of Search ............. 174/35 C, 35 R; 307/89; 324/158 P, 158 F, 73 R, 73 PC; 333/12

[56] References Cited

U.S. PATENT DOCUMENTS

| | | |
|---|---|---|
| Re. 31,477 | 12/1983 | Marshall . |
| 3,258,724 | 6/1966 | Walsh et al. ...................... 174/35 R |
| 3,596,228 | 7/1971 | Reed, Jr. .......................... 324/158 F |
| 3,866,119 | 2/1975 | Ardezzone et al. ............ 324/158 P |
| 3,963,986 | 6/1976 | Morton et al. . ................. 324/158 F |
| 3,967,223 | 6/1976 | McAvoy . |
| 4,069,453 | 1/1978 | Veenendaal ..................... 324/158 F |
| 4,184,133 | 1/1980 | Gehle . |
| 4,283,694 | 8/1981 | Pauker . |
| 4,339,628 | 7/1982 | Marcantonio et al. ........... 174/35 R |
| 4,574,235 | 3/1986 | Kelly et al. ..................... 324/158 F |

OTHER PUBLICATIONS

"Bridge Connector", by Ubermacher, IBM Tech. Disc. Bull., 1/66, vol. 8, #8, p. 1060.
J. Fetterolf, "Transmission-line Methods Speed 1-ns Data Along", Electronic Design, Jun. 21, 1980, pp. 95 thru 99.
Harris Microwave Semiconductor, "GaAs Digital IC Evaluation Kit HMK-11MSI-1", Aug. 1984, Product Data.

Primary Examiner—Reinhard J. Eisenzopf
Assistant Examiner—W. Burns
Attorney, Agent, or Firm—Ronald L. Taylor; A. W. Karambelas

[57] ABSTRACT

Gigahertz test jig apparatus (10) is disclosed for providing accurate and reliable evaluation of a wide variety of test devices which propagate signals having frequencies in excess of one gigahertz over a broad range of temperatures. A circular ground wall (12) encloses a multilayer arrangement of disc-shaped dielectric layers (18, 22) which both enclose and are attached to a conductive ground plane (20). Plated-through holes (26) are deployed at the periphery of each of the discs (18, 20, 22) in order to electrically coupled upper and lower ground rings (24, 25) to the ground wall (12) and the ground plane (20). External jig connectors (16) are mounted in connector holes (14) formed in the ground wall (12). Conductive signal traces (30A, 30B) are etched on the exterior faces of the dielectric discs (18, 22) and are joined to the external jig connectors (16) and test device pin terminals (28) which are arranged to receive and hold a test device (36) such as an integrated circuit.

7 Claims, 6 Drawing Figures

GIGA-HERTZ TEST JIG

The Government of the United States of America has rights in this invention pursuant to a government contract.

BACKGROUND OF THE INVENTION

1. Field of the Invention

The present invention relates to test jigs and related test equipment apparatus for extremely high speed transmission of signals.

2. Description of the Technology

Recent developments in the design and fabrication of integrated circuits have resulted in devices which produce signals which propagate faster than most test equipment is capable of detecting or measuring. Previous generations of high speed digital circuits could be evaluated for switching rise times and other output pulse characteristics by measuring equipment which was able to resolve pulses occurring over time periods lasting only billionths of a second. These intervals, now commonly referred to as nanoseconds, have become relatively long passages of time compared to the intervals spanned by signals generated by state-of-the-art digital circuitry. Transmission lines which convey these signals must now cope with waveforms having periods below the nanosecond range. The transmission of this electrical energy from the signal source to a receiving device poses new and difficult problems which were not encountered with apparatus operating below the one billion cycles per second or gigahertz frequency range.

Distortion caused by transmission pathways is proportional to the switching speed of the signals and to the length of the pathway. A significant portion of this distortion can be avoided by employing flat cable connectors, twisted pairs of conventional wire, or coaxial conductors. The distortion encountered when these prior pulse handling devices are used to convey gigahertz waveforms simply overwhelms the signal. A major component of this distortion is due to improper impedance matching. When impedance discontinuities are present in a test circuit configuration, unwanted reflections are created within the transmission pathway which degrade the signal by effectively cancelling out the transfer of energy from the signal source to the receiving circuit. These reflections arise when a signal encounters a sudden change in impedance somewhere along a transmission line. A simple technique which reduces these reflections is shortening the length of the interconnections or spacing the conducting lines more closely, but these two remedies create a concomitant disadvantage, in that they greatly enhance the problem of crosstalk, which is discussed below in detail. In a circuit in which the impedance is perfectly matched, both the source and the load at opposite ends of the transmission pathway match the characteristic impedance of the pathway.

Another type of distortion which corrupts signals is crosstalk. Fields of radiation which are propagated by electrical current flowing through transmission lines can induce currents in other nearby conductors. Both electrostatic and electromagnetic fields can produce unwanted interference in signal conveying transmission lines. A primary coupling mechanism which creates crosstalk is the capacitance between closely spaced conductors. Conductors which are near to each other develop a high mutual capacitance. Higher signal frequencies cause an even higher amount of energy to be transferred via capacitive coupling. Conventional shielding, which completely encloses a transmission line within a conductor which is grounded, can reduce a large share of this type of distortion caused by radiation, but extremely high signal frequencies tend to defeat such protective measures. One way to minimize crosstalk is by separating transmission lines by relatively large distances, but design constraints and countervailing sources of distortion which would be proportionally increased by larger line separations militate against using this tactic to reduce this source of noise. Another simple means of reducing crosstalk is to form a helical arrangement of pathways using two common insulated wires which are tightly twisted together. Althouth the added path length brought about by the winding of the conductors adds time delays and other forms of distortion, radiation from each wire in such a twisted pair substantially cancels that emitted by the other and thus cuts down on crosstalk.

Flat cables comprising insulated, round or flat wires which are bound together to form integrated, ribbon-like strips are also employed in attempts to mitigate crosstalk distortion. Conductors which lie side by side, and which are kept apart and are sealed within an insulating material, can be segregated with alternating ground wires between the signal carrying lines. The diminution in crosstalk achieved by this technique is directly proportional to the number of ground wires interspersed among the transmission wires.

Techniques which address the problems of impedance mismatches and crosstalk are descirbed by James Fetterolf in an article entitled "Transmission-line Methods Speed 1-ns Data Along" published in the June 21, 1980 edition of *Electronic Design* on pages 95 through 99. This publication is geneally concerned with prior art technology which can be employed to construct single layer printed circuit boards in which unreliable jig delays and uncertain propagation times cause severe difficulties in accurately evaluation test equipment.

In U.S. Pat. No. Re. 41,477, Marshall descirbs a multi-signal transmission line formed of a flat cable having a plurality of generally parallel conductors embedded in a dielectric core material. Marshall asserts that his composite transmission line cable reduces far end line-to-line interference between the signal conductor and adjacent quiet lines.

U.S. Pat. No. 4,283,694—Pauker discloses an impedance matching microstrip network for matching a predetermined impedance to a lower impedance over a wide frequency band. This impedance matching device is used in a Gunn-diode oscillator which is tuned over a wide frequency band by means of a small ball of yttrium-iron garnate which is placed in a static magnetic field.

Gehle discloses a microwave integrated circuit in an assembly having a structurally continuous ground plane of conductive material in U.S. Pat. No. 4,184,133. The microwave integrated circuit substrate is mounted to a carrier or chassis by a layer of dielectric material interposed between the lower surface of the substrate and the carrier.

McAvoy describes a resonant ring transmission line having a high Q mode in U.S. Pat. No. 3,967,223. This invention comprises a resonant ring transmission line coupled to a microstrip transmission line.

None of the preceding inventions solves the problems of the deleterious effects of crosstalk and imepedance matching to an extent that would allow for the reliable testing of integrated circuit devices which proprogate gigahertz frequency signals. None of the prior art devices provides an effective and relatively inexpensive solution to the electrical distortions described above in detail which plague the operation of currently available test equipment. Such a solution would satisfy a long felt need manifested by the current efforts of the electronics test equipment industry, which continues to attempt to develop measurement systems which can cope with the ever-increasing speed of operation of new integrated circuit devices. The development and manufacture of extremely high speed integrated circuit systems has generated a concomitant need for an invention which is capable of measuring signals from these devices.

Such an invention would ideally be suited to function effectively with many different integrated circuit packaging configurations and would be easily adapted to a variety of automatic test equipment systems. Such an innovative, new test jig would be capable of subjecting a test device to extreme ranges of temperature without causing the degradation of test data. This new test jig would expand the bandwidth of currently available test equipment to the gigahertz range while eliminating the tedious and extremely inconvenient standard practice of subtracting unreliable jig delays from final measured test data values.

SUMMARY OF THE INVENTION

The present invention overcomes and avoids the problems encountered in the employment of prior art devices by providing a multi-layer assembly of alternating planes of dielectric and conductive material. Signal traces are etched directly on the exterior surfaces of the dielectric layers which face away from the conductive, ground plane which they enclose. The gound plane is connected to ground rings which encircle the edges of the dielectric layers and to a ground wall which extends vertically along the circumference of the cylindrical assembly by a multitude of plated-through holes which traverse all the layers in the jig.

The present invention provides an efficacious, practical, cost-effective, and straightforward solution to the problems of impedance mismatches and crosstalk encountered when testing gigahertz frequency signals generated by integrated circuit devices. The gigahertz test jig is capable of accurately testing integrated circuit devices subjected to the full extent of military range temperature extremes of −55 to +125 degrees Centigrade over a bandwidth in excess of one gigahertz. The invention can test passive, digital, or linear components and can be modified to be compatible with a broad array of integrated circuit packaging configurations.

It is, therefore, an object of the present invention to extend the range of test jigs to the gigahertz frequency range while providing an effective means to reduce crosstalk and interference between closely spaced transmission lines as well as to supply means to effectively eliminate impedance mismatches between test devices and their associated test circuitry.

Another object of the invention is to provide a simple means of fabricating multilayer transmission line printed circuit boards.

Yet another object of the invention is to provide a test jig which is easily connected and disconnected from integrated circuit test devices and which can be used with either all or only some of the signal traces coupled to the test device.

Still another object of the present invention is to provide a test apparatus which is compatible with automatic test devices.

Another important object of the invention is to provide a test jig which can subject a wide variety of test devices, including passive, linear, and digital components, to extreme variations in temperature without causing the degradation of test signals from the device.

Yet another object of the invention is to supply a universal test jig which eliminates the watseful and time-consuming task of adjusting and correcting unreliable jig delays after all test values have been measured, as is the standard practice in operation of prior art devices.

Another object of the invention is to provide a highly versatile test system which has a broad range of applications potential. This test sytem provides a variable impedance capability which can be tailored to any test design constraint by simply changing the widths of the signal traces to properly match circuit impedance and to accurately predict interconnect delays.

An appreciation of other aims and objects along with a more complete and comprehensive understanding of the present invention may be achieved through the study of the following description of a preferred embodiment in addition to reference to the accompanying drawings.

DESCRIPTION OF A PREFERRED EMBODIMENT

Figure 1:
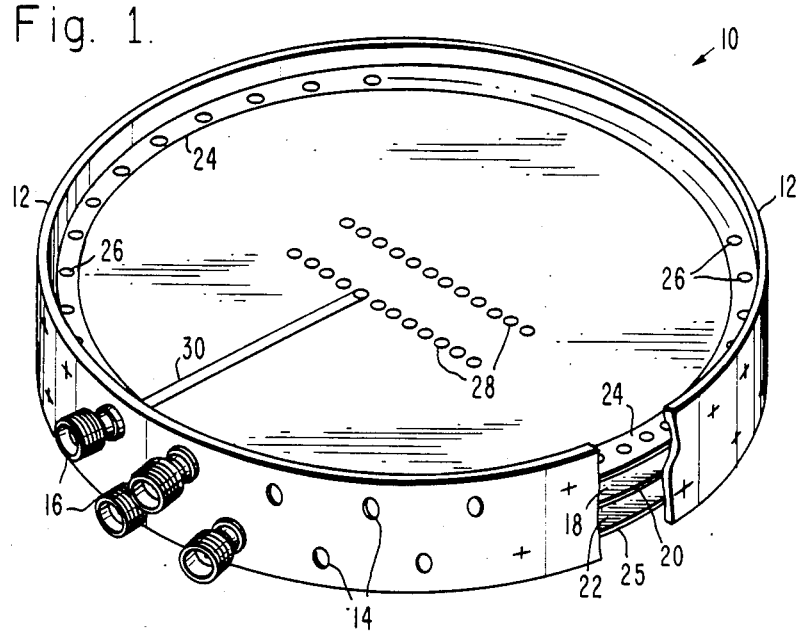
FIG. 1 is a perspective view of the present invention showing a three layer arrangement having a central ground planes and two dielectric layers on either side of the ground plane. In this illustration, only one signal trace is shown on the top dielectric layer connecting a test device pin terminal to an external test jig connector.

FIG. 1 shows the present invention in one of its several alternative forms. Although the invention can be constructed using any number of layers greater than or equal to three, the simplest embodiment of the gigahertz test jig includes three layers and comprises a layer of conductive material, commonly referred to as a ground plane, between two exterior layers of dielectric material. The apparatus illustrated in FIG. 1 is a three layered universal gigahertz test jig 10 which is girded by a ground wall 12 made of a suitable conductive material. In the preferred embodiment, copper tubing is used to construct this enclosing, vertical boundary which encircles the strata of discs within it. The ground wall 12 provides mechanical strength to the entire assembly 10 and is electrically coupled to ground rings 24 and 25 (See FIG. 4) by soldered joints to plated through holes 26 which surround the perimeter of the stacked printed circuit board assembly. The ground rings 24 and 25 are circular bands or strips of metal one eighth of an inch wide which are located along the perimeters of dielectric layers 18 and 22 respectively. In the preferred embodiment, the ground rings 24 and 25 are electroplated layers of metal which extend inward from the rim of each dielectric disc 18, 22 and also coat the thin exterior surface of the disc which is perpendicular to the face of the disc and parallel to the surface of the ground wall 12 which the disc abuts. A highly reliable and durable mechanical and electrical bond between the ground wall 12 and the plurality of outer disc edges, which lie perpendicular to the working surface of the test jig 10, is obtained by the snug mechanical fit of the ground wall 12 up against the stack of layers in addition to numerous solder joints which are formed all along the circular boundary of ground rings 24 and 25 and ground wall 12. The plated through holes 26 formed in the ground rings 24 and 25 extend vertically through each of the three layers 18, 20, and 22 of the test jig 10 and provide multiple electrical connections to the centrally located ground layer 20. These multiple electrical connections create a continuous ground plane up to and including ground wall 12. The illustrated embodiment employs forty-eight plated-through holes 26 to connect ground wall 12 and ground rings 24 and 25 to central ground plane layer 20. One important feature of the invention is to provide as many plated-through holes 26 as possible in order to ensure a reliable ground plane 20.

Two parallel rows of vertically offset connector holes 14 enable external jig connectors 16 to be mounted onto the ground wall 12. The external jig connectors 16 are offset both in the vertical and horizontal planes in order to closely match the thicknesses of the individual layers of the jib 10. In the illustrated examples of the present invention, common commercially available miniature RF couplers having the trade name OSM connectors are utilized. These OSM connectors are manufactured by OMNI-Spectre Company, Incorporated.

The topmost layer revealed by the cut-away section of FIG. 1 is a disc-shaped dielectric layer 18 which has a ground ring 24 running all along its circumference. This particular embodiment of the invention incorporates discs which are 4.75 inches in diameter. Ground rings 24 and 25 are etched on dielectric layers 18 and 22 using convential printed circuit board etching techniques which are well known to those having ordinary skill in the art. The dielectric material may be selected according to the particular needs of the user, but the dielectric constant and strength of the material are important design constraints. The preferred embodiment is constructed from FR-4 epoxy/glass laminate, which is readily available commercially and is itself manufactured from Style 7628 glass cloth. This material is especially well suited for the gigahertz test jig since its inherent strength and stiffness resists flexing and bending which would seriously complicate or distort test signals from a device mounted in the jig. This epoxy glass laminate material has a dielectric constant of about 5. Once a dielectric material which satisfies the design constraints and criteria of the particular test jig is selected, the various parameters of the jig's components can be adjusted to meet the task of building a test jig which has a standard, fifty ohm characteristic impedance.

Beneath the topmost dielectric layer 18 illustrated in FIG. 1 and below the lowest dielectric layer 22 is a ground layer 20 which is preferably a thin disc of copper. The copper disc is attached directly to the dielectric material which surrounds it on either side by an adhesive bond. Alternatively, the metal ground plane 20 can be formed by electroplating a thin, two mil layer or coating directly upon one or more of the dielectric discs 18, 22. It is important to insure that the ground plane 20 is of uniform thickness and that it is kept relatively thin if it is formed using electroplating. Excessively thick ground plane layers can add undesirable weight, add thermal distortions, and exacerbate construction costs unnecessarily. An important feature of the ground plane 20, however, is that it can also be employed to function as a heat sink which helps to dissipate operating heat from the test device mounted on the jig 10. The unitary or slab-like version of the copper plane 20 which can function as a heat sink may be 0.125 inches thick or greater, depending on the amount of heat which must be dissipated.

Figure 2:
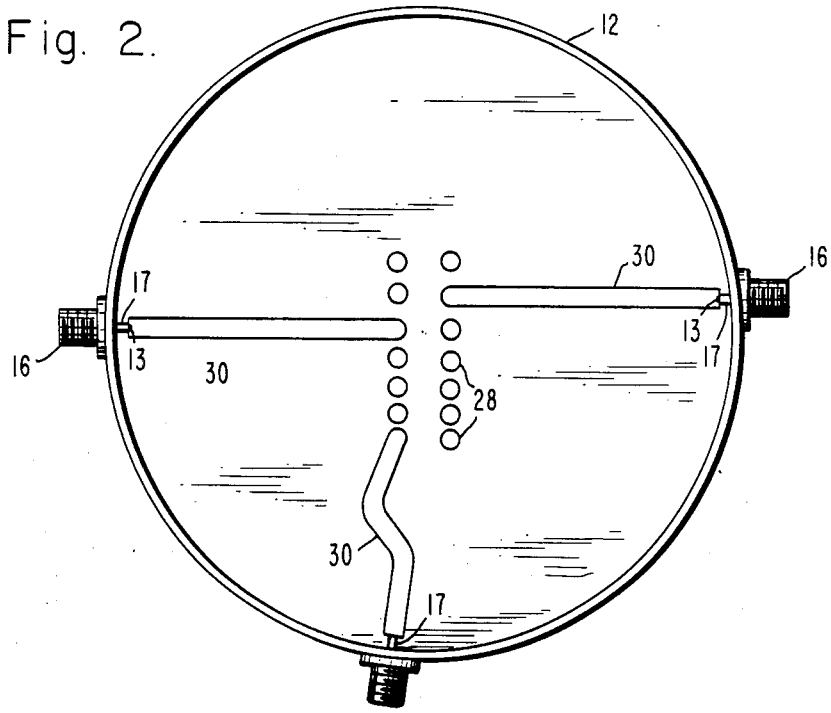
FIG. 2 is a top view of the test jig showing three signal traces including a curved trace which is shaped to preserve the parity of all of the several trace path lengths.
Figure 5:
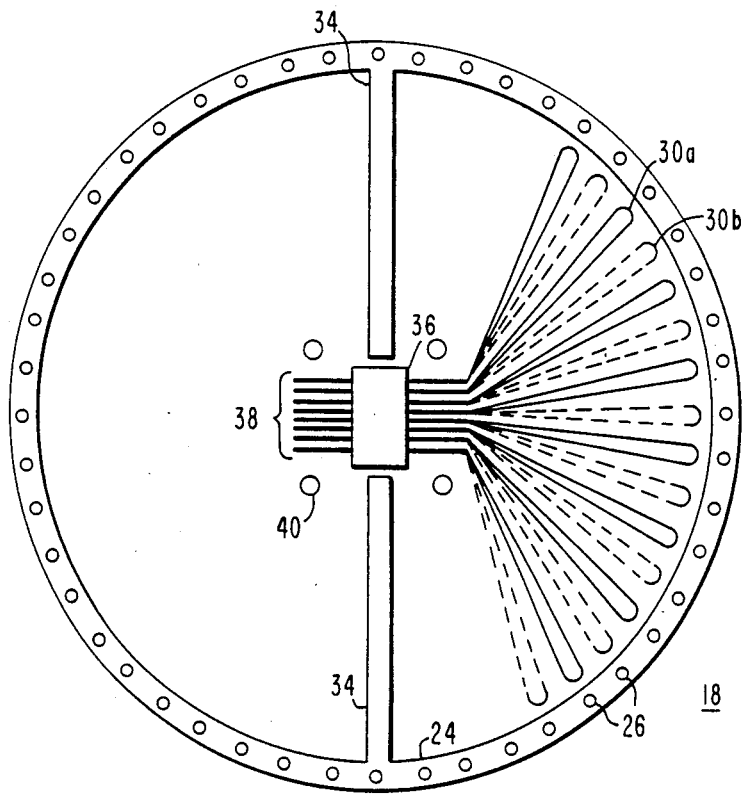
FIG. 5 is a top view of an alternative embodiment of one of the dielectric discs of the present invention which also shows a mounted, flat-pack integrated circuit device on the test jig.
Figure 6:
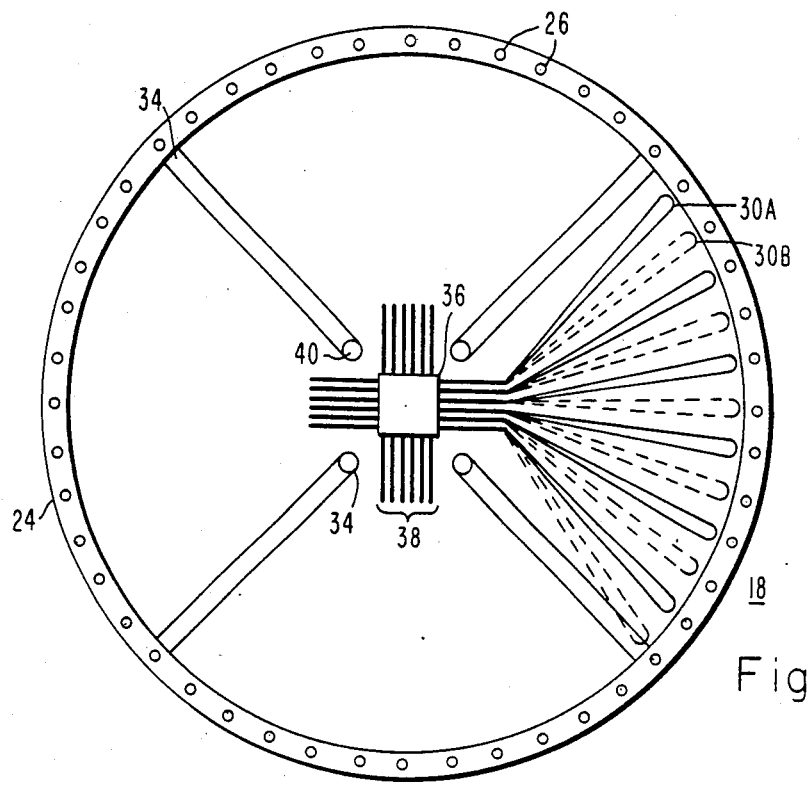
FIG. 6 is a top view of yet another alternative embodiment which shows a dielectric disc including another integrated circuit package mounted on the test jig.

FIG. 2 shows three conductive surface channels, commonly referred to as signal traces 30, etched upon the face of the topmost dielectric layer 18. These narrow bands of metal connect the device to be tested (36 as shown in FIGS. 5 and 6) to external test equipment (not shown). Although FIG. 2 is a top view of this embodiment, a bottom view would be identical, since both sides of test jig 10 have faces made of dielectric layers which carry traces 30 from test device pin terminals 28 to external jig connectors 16. One of the important aspects of this invention is that the top and bottom dielectric layers may be fashioned so that they are each reflections or duplicates of each other. This configuration of signal traces results in having two identical pathways coupled to each pin of the test device. Each trace or pathway is deployed in equal length so that each can function as both an input and an output signal trace.

In yet another embodiment of the present invention, each tract on dielectric layer 18 can be employed as a force trace 30A, also called a signal or input trace, which brings a test signal to the test device from outside the test jig 10. Similarly, each trace on the bottom dielectric layer 22 can be employed solely as a sense or output trace 30B which carries information through the jig to peripherial measurement devices.

The signal traces 30 can be shaped or formed into any desired pathway. The bends in the traces are generally limited to angles of less than sixty degrees in order to avoid deleterious reflections and distortions in the signals which they convey. Various patterns of bends and curves are introduced in order to preserve the parity of pathlengths among all the traces, which thereby assures predictable signal transit times through the jig.

Figure 4:
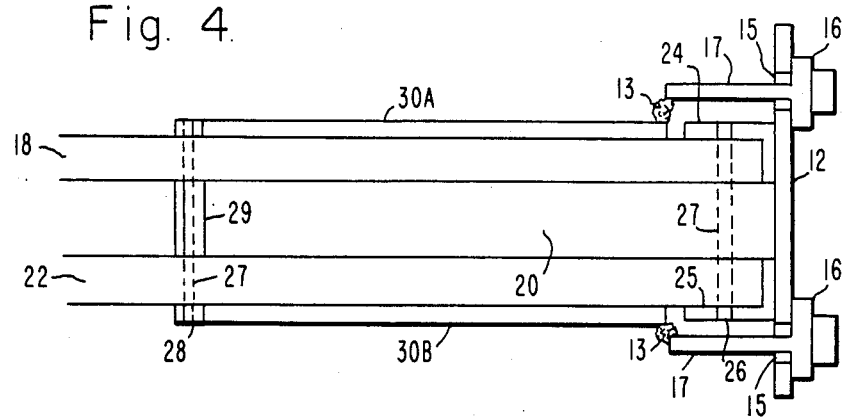
FIG. 4 is a partial, cross-sectional view of the three layer embodiment shown in FIG. 1.

The relationship between dielectric layers 18 and 22 and traces 30A and 30B are best understood by viewing FIG. 4, which shows the preferred embodiment in partial cross-section. FIG. 4 also best illustrates the various connections within the multi-layer test jig 10. The central regions of dielectric layers 18 and 22 bear patterns of spaced holes 28 which correspond precisely to the pin arrangement of particular integrated circuit device packages. These spaced holes 28, which comprise the jig's test device pin terminals means, are coated over with a conductive layer which joins to each hole's respective trace 30 via vertically running conductive coated shafts 27 so that a device which is to be tested in the jig may be placed directly in the array of spaced holes. In this way, an integrated circuit or other device is both electrically coupled to and mechanically supported by this configuration of pin receiving terminals 28.

Figure 3:
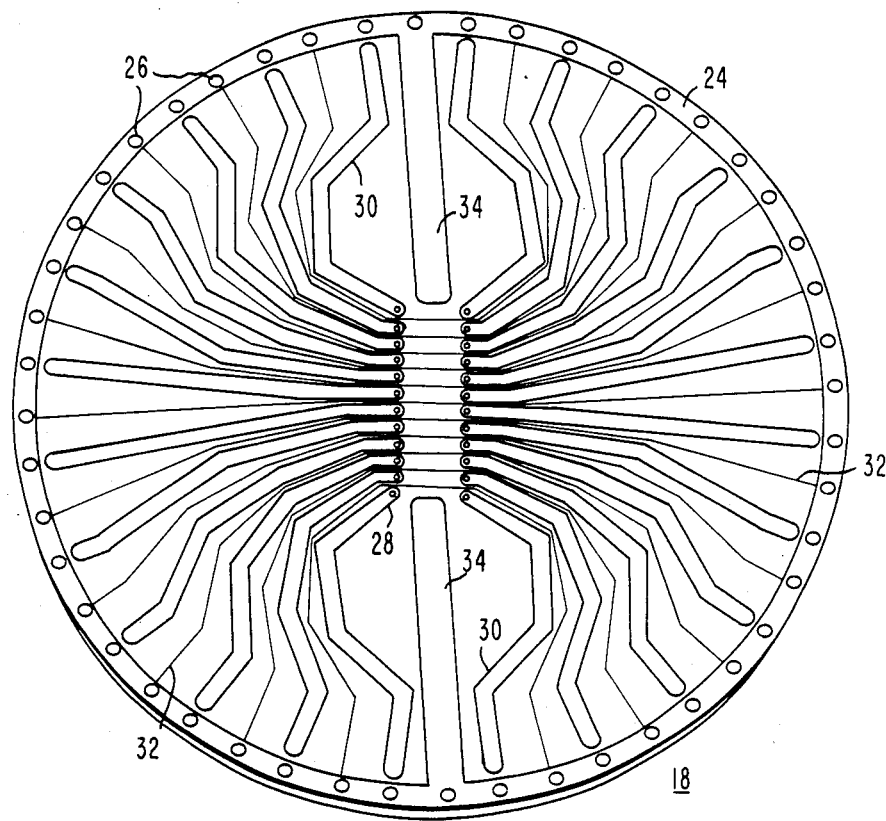
FIG. 3 is a top view of one of the exterior dielectric discs or layers shown in FIG. 1 including a full array of signal traces separated by thin ground shields.

It will, therefore, be apparent to any person ordinarily skilled in the art that any desired pattern of holes 28, which each form the terminus of a trace 30, can be arranged and drilled through both dielectric layers. In this way, any integrated circuit package can be accomodated by the present invention. FIGS. 1, 2, and 3 each depict an array of such terminals 28 which would register with an integrated circuit housed in what is commonly known as an in-line package. FIGS. 5 and 6 show alternative schemes for the positions of the terminals 28 which would enable the jig to easily and reliably test flat package integrated circuit devices 36 having fourteen and twenty-four pins 28, respectively.

The invention may be easily modified to test flat-pack integrated circuits or devices as is shown in FIGS. 5 and 6. Both these drawings depict yet another illustrative embodiment of the invention, including multiple ground traces 34, which may be connected to test device mounting holes 40 for providing sure and reliable grounds to the test device 36. Integrated circuit leads 38 are shown radiating out from a test device 36 which are joined to traces 30A and 30B. In both FIGS. 5 and 6, one set of traces 30B is displaced 45 degrees from the other set of traces 30A in order to better accomodate the placement of their associated external jig connectors on the surrounding ground wall 12.

FIG. 4 shows one pair of such terminals or holes 28 which are electrically coupled by a vertical plated-through conductor coated shaft 27 which runs through all three layers 18, 20, and 22. Each conductor coated shaft 27 connects a pair of terminals 28, just as each set of vertically registered plated-through holes 26 is joined by these conductive passageways. Ground plane 20 is electrically isolated from the signal carrying traces 30A and 30B by a clearance hole or space 29 formed in the ground plane 20. Both traces 30A and 30B are linked to external jig connectors 16 by a solder joint 13 which mechanically and electrically couples the long, narrow probe portions 17 of each external jig connector 16. Connectors 16 are separated from ground wall 12 by insulating teflon washers 15 which are built into the connectors 16.

FIG. 3 shows a complete illustrative array of traces 30 on a single dielectric disc 18. The metal strips which are etched on the disc include a pair of ground traces 34 which are used to make any needed ground connections to the test device. FIG. 3 also includes a plurality of ground shields 32 formed in approximately five mil wide lines which are placed in between each signal trace 30.

Another important design aspect of the invention is the ease with which the test jig's characteristic impedance may be altered to suit a wide range of test environments. The preferred embodiment is designed to conform to the industry standard characteristic impedance of fifty ohms, but can be fashioned to complement any external test environment or device which might be used in conjunction with the jig. By adjusting the height, h, of the dielectric layers 18 and 22 together with the width, w, and thickness, t, of the signal traces 30, the characteristic impedance $Z_o$ of the test jig can be modified to fit any dielectric material having a dielectric constant e.

Although the present invention has been described in detail with reference to a particular preferred embodiment, persons having ordinary skill in the art will appreciate that various modifications and alterations may be made without departing from the spirit and scope of the invention.

What is claimed is:

1. A test jig comprising:
   a disc of metal having two substantially planar major surfaces serving as a ground plane and heat sink for the test jig;
   a first substantially coextensive dielectric layer on one surface of the disc, said first dielectric layer having a plurality of signal traces formed on an outer surface of the layer which generally radiate outwardly from a centrally located test device receiving area, said first dielectric layer further including a ground ring on peripheral portions thereof surrounding said signal traces;
   a second substantially coextensive dielectric layer on the opposite major surface of the disc, said second dielectric layer having a plurality of signal traces and a ground ring surrounding said signal traces on peripheral portions of said second dielectric layer;
   a metallic annular member surrounding said disc and dielectric layers having a wall extending in a direction transverse thereto;
   means for physically and electrically connecting the wall of the annular member to edges of the disc and ground rings on the first and second dielectric layers; and
   a plurality of external connectors mounted in the wall, each connector being coupled to a given trace on one of the dielectric layers.

2. The jig of claim 1 wherein the signal traces on said first and second dielectric layers are essentially duplicates of each other, with the test device receiving area including means for connecting inner ends of corresponding traces on the first and second dielectric layers together thereby providing two substantially identical pathways which can be coupled to each pin of a test device.

3. The jig of claim 2 wherein said means for connecting comprises electrically conductive material extending through a hole formed through the dielectric layers and said disc, said hole being configured so as to receive a pin of the test device thereby providing both mechanical and electrical connection to the jig.

4. The jig of claim 3 which further comprises:
   a plurality of plated through holes located about the periphery of the jig serving to electrically couple the ground rings on the dielectric layers to the disc.

5. The jig of claim 4 wherein the connectors are staggered about the periphery of the annular wall.

6. The jig of claim 4 wherein said connectors each include a probe portion which extends through the wall over the ground ring in one of the dielectric layers, with the end of the probe terminating substantially above an outer end of one of the signal traces, with the connector probe portion and trace end being soldered together.

7. The test jig of claim 6 wherein said dielectric layers are discs of epoxy/glass laminate material having a dielectric constant of approximately 5.

* * * * *